United States Patent
Sato et al.

(10) Patent No.: US 9,752,033 B2
(45) Date of Patent: *Sep. 5, 2017

(54) PRODUCTION METHOD FOR FINE ORGANIC PIGMENT

(71) Applicant: KAO CORPORATION, Tokyo (JP)

(72) Inventors: Takahiro Sato, Wakayama (JP); Hironobu Fukuroi, Wakayama (JP); Hirotaka Takeno, Wakayama (JP)

(73) Assignee: KAO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/891,192

(22) PCT Filed: May 14, 2014

(86) PCT No.: PCT/JP2014/062886
§ 371 (c)(1),
(2) Date: Nov. 13, 2015

(87) PCT Pub. No.: WO2014/185471
PCT Pub. Date: Nov. 20, 2014

(65) Prior Publication Data
US 2016/0090484 A1   Mar. 31, 2016

(30) Foreign Application Priority Data

May 14, 2013 (JP) ................................ 2013-102198
Dec. 26, 2013 (JP) ................................ 2013-270393

(51) Int. Cl.
| | |
|---|---|
| C09B 67/02 | (2006.01) |
| C09B 67/00 | (2006.01) |
| C09D 11/00 | (2014.01) |
| C09D 17/00 | (2006.01) |
| C09B 67/04 | (2006.01) |
| C09B 67/46 | (2006.01) |
| C09D 11/322 | (2014.01) |
| C09B 67/20 | (2006.01) |
| G03F 7/00 | (2006.01) |

(52) U.S. Cl.
CPC ...... C09B 67/0022 (2013.01); C09B 67/0002 (2013.01); C09B 67/006 (2013.01); C09B 67/009 (2013.01); C09B 67/0066 (2013.01); C09D 11/00 (2013.01); C09D 11/322 (2013.01); C09D 17/00 (2013.01); G03F 7/0007 (2013.01)

(58) Field of Classification Search
CPC .............. C09B 67/0002; C09B 67/006; C09B 67/0066; C09B 67/009; C09B 67/0022; C09D 11/00; C09D 11/322; C09D 17/00; G03F 7/007

See application file for complete search history.

(56) References Cited

U.S. PATENT DOCUMENTS

| | | | | |
|---|---|---|---|---|
| 5,716,435 A | * | 2/1998 | Aida | C09D 11/322 106/31.65 |
| 7,147,704 B2 | * | 12/2006 | Ueno | C09B 25/00 106/413 |
| 2009/0305156 A1 | | 12/2009 | Weber et al. | |
| 2011/0091804 A1 | | 4/2011 | Geisenberger et al. | |

FOREIGN PATENT DOCUMENTS

| | | | |
|---|---|---|---|
| DE | 10152136 A1 | * | 10/2001 |
| EP | 1270680 A2 | | 1/2003 |
| EP | 1884543 A1 | | 2/2008 |

(Continued)

OTHER PUBLICATIONS

Machine Translation of Japanese Patent Specification No. JP 2009-221376 A (Oct. 2009).*

(Continued)

Primary Examiner — Anthony J Green
(74) Attorney, Agent, or Firm — Birch, Stewart, Kolasch & Birch, LLP

(57) ABSTRACT

The present invention provides a process for producing a fine organic pigment having a very small primary particle size, and a fine organic pigment produced by the process; a process for producing a dispersion using the fine organic pigment, and a dispersion produced by the process; and a process for producing an ink using the dispersion. The present invention relates to [1] a process for producing a fine organic pigment, including step 1 of kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water-soluble inorganic salt; [2] a fine organic pigment produced by the process described in the above [1]; [3] a dispersion produced using the fine organic pigment described in the above [2]; [4] a process for producing a paste of a fine organic pigment, including step 2 of cleaning the kneaded mixture obtained in the step 1; [5] a process for producing a dispersion, including step 3 of subjecting the paste of the fine organic pigment produced by the process described in the above [4], an organic solvent and water to dispersing treatment; and [6] a process for producing an ink, including step 4 of mixing the dispersion produced by the process described in the above [5], with at least one material selected from the group consisting of water and an organic solvent.

14 Claims, No Drawings

(56) References Cited

FOREIGN PATENT DOCUMENTS

| JP | 63-248864 A | | 10/1988 |
|---|---|---|---|
| JP | 2006-152103 A | * | 6/2006 |
| JP | 2009-221376 A | | 10/2009 |
| JP | 2012-025920 A | | 2/2012 |

OTHER PUBLICATIONS

International Search Report issued in PCT/JP2014/062886, mailed on Jul. 8, 2014.
European Patent Office Communication and extended search report issued in the corresponding European Patent Application No. 14797726.8 on Feb. 6, 2017.

* cited by examiner

PRODUCTION METHOD FOR FINE ORGANIC PIGMENT

FIELD OF THE INVENTION

The present invention relates to a process for producing a fine organic pigment, and a fine organic pigment produced by the process; a process for producing a dispersion using the fine organic pigment, and a dispersion produced by the process; and a process for producing an ink using the dispersion.

BACKGROUND OF THE INVENTION

In ink-jet printing methods, droplets of ink are projected onto a recording medium from very fine nozzles and allowed to adhere to the recording medium to obtain printed matters on which characters, images, etc., are printed. The printed matters are required to have high optical density and gloss, whereas the inks for ink-jet printing are required to have a high ejection property. In addition, color filters for liquid crystal displays are required to exhibit high contrast ratio and brightness. Therefore, pigments used in the inks for ink-jet printing and color filters are in the form of fine pigment particles having a very small primary particle size.

As the method of obtaining a fine organic pigment by reducing a primary particle size of a pigment as a raw material, there are extensively used wet kneading and milling methods such as solvent salt milling, dry milling methods, etc. The solvent salt milling means a milling method of atomizing a powder, etc., by a wet kneading method using a water-soluble inorganic salt as pulverization media. For example, by mechanically kneading the raw material pigment and the water-soluble inorganic salt together with a water-soluble organic solvent, it is possible to pulverize the pigment and reduce a primary particle size of the pigment.

Patent Literature 1 discloses a process for producing a fine organic pigment in the presence of an alkaline substance by a solvent salt milling method.

CITATION LIST

Patent Literature

Patent Literature 1; JP 2012-025920A

SUMMARY OF THE INVENTION

Technical Problem

The wet kneading method such as, typically, solvent salt milling is a useful method for pulverizing a pigment. As the primary particle size of the resulting organic pigment is reduced, the ink for ink-jet printing or color filter using the organic pigment can be further improved in properties thereof. Therefore, there is an increasing demand for methods for producing organic pigments having a smaller primary particle size.

According to the present invention, there are provided a process for producing a fine organic pigment having a very small primary particle size, and a fine organic pigment produced by the process; a process for producing a dispersion using the fine organic pigment, and a dispersion produced by the process; and a process for producing an ink using the dispersion.

Solution to Problem

The present inventors have found that by blending a predetermined amount of water in a mixture of a raw material organic pigment, a water-soluble organic solvent and a water-soluble inorganic salt and kneading the resulting mixture, it is possible to obtain a fine organic pigment having a very small primary particle size.

That is, the present invention relates to the following aspects [1] to [6].

[1] A process for producing a fine organic pigment, including step 1 of kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water-soluble inorganic salt.

[2] A fine organic pigment produced by the process according to the above aspect [1].

[3] A dispersion produced using the fine organic pigment according to the above aspect [2].

[4] A process for producing a paste of a fine organic pigment, including the following step 2:

step 2: cleaning the kneaded mixture obtained in the step 1.

[5] A process for producing a dispersion, including the following step 3:

step 3: subjecting the paste of the fine organic pigment produced by the process according to the above aspect [4], an organic solvent and water to dispersing treatment.

[6] A process for producing an ink, including the following step 4:

step 4: mixing the dispersion produced by the process according to the above aspect [5], with at least one material selected from the group consisting of water and an organic solvent.

Advantageous Effects of Invention

In accordance with the present invention, there are provided a process for producing a fine organic pigment having a very small primary particle size, and a fine organic pigment produced by the process; a process for producing a dispersion using the fine organic pigment, and a dispersion produced by the process; and a process for producing an ink using the dispersion.

DESCRIPTION OF EMBODIMENTS

The present invention relates to a process for producing a fine organic pigment, including the step of kneading a mixture prepared by blending a raw material organic pigment, a water-soluble inorganic salt, a water-soluble organic solvent and water with each other (hereinafter also referred to as a "mixture to be kneaded"), the water being blended in an amount of not less than 0.6 part by mass and not more than 4.0 parts by mass on the basis of 100 parts by mass of the water-soluble inorganic salt (the step is hereinafter also referred to as a "kneading step" or "step 1"). In the process for producing a fine organic pigment according to the present invention, it is possible to produce the fine organic pigment having a very small primary particle size.

The mechanism of attaining the effects of the present invention is estimated as follows though details thereof have not been clearly determined yet. That is, upon atomizing the raw material organic pigment by wet-kneading method using the water-soluble organic solvent, the water-soluble inorganic salt is functioned as pulverization media. When blending a specific amount of water therewith, the water serves for dissolving merely a near-surface portion of the water-soluble inorganic salt to impart viscosity to the surface of the water-soluble inorganic salt. As a result, the shear stress on the surface of the water-soluble inorganic salt is increased, so that the pulverization efficiency of the pigment is enhanced. For this reason, it is possible to obtain a still finer pigment with high efficiency. However, the above discussion is merely estimation, and the present invention is therefore not particularly limited thereto.

[Raw Material Organic Pigment]

The raw material organic pigment used in the present invention means an organic pigment before being kneaded.

As the raw material organic pigment, there is preferably used at least one pigment selected from the group consisting of condensed polycyclic pigments such as anthraquinone pigments, quinacridone pigments, indigo pigments, dioxazine pigments, perylene pigments, perinone pigments, isoindolinone pigments, isoindoline pigments, phthalocyanine pigments, quinophthalone pigments and diketopyrrolopyrrole pigments, and azo pigments such as disazo pigments and condensed azo pigments.

Of these organic pigments, from the viewpoint of usefulness of the resulting fine organic pigment, preferred are quinacridone pigments, quinophthalone pigments, diketopyrrolopyrrole pigments and phthalocyanine pigments.

The primary particle size of the raw material organic pigment is preferably not more than 500 nm, more preferably not more than 200 nm and even more preferably not more than 100 nm, from the viewpoint of good pulverization efficiency. Also, the primary particle size of the raw material organic pigment is, for example, not less than 60 nm. The primary particle size of the raw material organic pigment may be measured by the method described in Examples below.

[Pigment Derivative]

The mixture to be kneaded may also contain various pigment derivatives. The pigment derivatives are preferably in the form of a derivative of the raw material organic pigment compound. Examples of a substituent group contained in the pigment derivatives include a hydroxyl group, a carboxy group, a carbamoyl group, a sulfo group, a sulfonamide group and a phthalimidomethyl group. In addition, the pigment derivatives also include aromatic polycyclic compounds generally constituting no unit structure of organic pigments, such as naphthalene compounds and anthraquinone compounds. These pigment derivatives may be used alone or in combination of any two or more thereof.

The content of the pigment derivatives in the mixture to be kneaded is preferably not less than 0.05 part by mass and more preferably not less than 0.1 part by mass on the basis of 100 parts by mass of the raw material organic pigment, from the viewpoint of good dispersibility and atomization of the pigment, and is also preferably not more than 5 parts by mass, more preferably not more than 1 part by mass and even more preferably not more than 0.2 part by mass on the basis of 100 parts by mass of the raw material organic pigment, from the viewpoint of suppressing change in hue of the pigment. Further, from the viewpoints of suppressing change in hue of the pigment and atomizing the pigment particles, the mixture to be kneaded preferably contains substantially no pigment derivatives.

[Water-Soluble Inorganic Salt]

In the present invention, the water-soluble inorganic salt that is blended in the mixture to be kneaded is preferably a metal salt, more preferably a metal chloride or a metal sulfate, and even more preferably a metal chloride, from the viewpoint of good pulverization efficiency. The metal of the metal salt is preferably at least one metal selected from the group consisting of an alkali metal and a Group 2 element, and more preferably an alkali metal, from the viewpoints of good water solubility, economy and availability. In addition, from the viewpoints of good economy and availability, the metal of the metal salt is preferably at least one metal selected from the group consisting of sodium, potassium and magnesium, and more preferably sodium. From the viewpoints of good pulverization efficiency and water solubility, the water-soluble inorganic salt is preferably at least one compound selected from the group consisting of an alkali metal chloride and an alkali metal sulfate, and more preferably an alkali metal chloride. In addition, from the viewpoints of good economy and availability, the water-soluble inorganic salt is preferably at least one compound selected from the group consisting of sodium chloride, potassium chloride, sodium sulfate, zinc chloride, calcium chloride and magnesium chloride, more preferably at least one compound selected from the group consisting of sodium chloride and sodium sulfate, and even more preferably sodium chloride.

The solubility of the water-soluble inorganic salt in 100 g of water as measured at 20° C. is preferably not less than 10 g, more preferably not less than 20 g, and even more preferably not less than 30 g, from the viewpoint of facilitated removal of the water-soluble inorganic salt from the mixture obtained though the kneading step, and is also preferably not more than 100 g, more preferably not more than 60 g, and even more preferably not more than 40 g, from the viewpoint of good pulverization efficiency.

The water-soluble inorganic salt is preferably hardly soluble in the water-soluble organic solvent, and more preferably substantially insoluble in the water-soluble organic solvent. The solubility of the water-soluble inorganic salt used in the present invention in 100 g of the water-soluble organic solvent as measured at 20° C. is preferably not more than 10 g, and more preferably not more than 1 g, from the viewpoint of high productivity of the fine organic pigment.

The water-soluble inorganic salt is preferably in the form of particles from the viewpoint of good handling property. The average particle size of the water-soluble inorganic salt is preferably not more than 1000 μm, more preferably not more than 700 μm, even more preferably not more than 400 μm, further even more preferably not more than 200 μm, further even more preferably not more than 50 μm, and further even more preferably not more than 20 μm, from the viewpoint of good pulverization efficiency, and is also preferably not less than 0.1 μm, more preferably not less than 1 μm, and even more preferably not less than 5 μm, from the viewpoint of high productivity.

[Water-Soluble Organic Solvent]

In the present invention, the water-soluble organic solvent blended in the mixture to be kneaded is preferably an organic solvent that is miscible with water at an optional ratio, from the viewpoint of facilitated removal of the water-soluble organic solvent from the mixture obtained though the kneading step.

The water-soluble organic solvent is preferably in the form of an aliphatic compound containing an alcoholic hydroxyl group from the viewpoints of good safety, economy and availability. The number of the alcoholic hydroxyl groups contained in the aliphatic compound as the water-soluble organic solvent is preferably not less than 1, and more preferably not less than 2, from the viewpoints of good safety and workability, and is also preferably not more than 3, more preferably not more than 2, and even more preferably 2, from the viewpoints of good handling property, economy and availability. In addition, the water-soluble organic solvent preferably contains an ether bond, from the viewpoint of good safety. The number of the ether bonds contained in the water-soluble organic solvent is preferably not more than 3, and more preferably not more than 2, and is also preferably not less than 1, and more preferably 1, from the viewpoints of good handling property, economy and availability.

Examples of the water-soluble organic solvent include at least one compound selected from the group consisting of ethylene glycol, diethylene glycol, diethylene glycol monoalkyl ethers, triethylene glycol, triethylene glycol monoalkyl ethers, polyethylene glycol, propylene glycol, dipropylene glycol, dipropylene glycol monoalkyl ethers, polypropylene glycol, 2-propanol, 1-propanol, isobutyl alcohol, 1-butanol, isopentyl alcohol, 1-pentanol, isohexyl alcohol, 1-hexanol and glycerol. Of these water-soluble organic solvents, from the viewpoints of good safety, economy and availability, preferred are glycol-based compounds such as diethylene glycol, propylene glycol, triethylene glycol and polyethylene glycol, and glycerol, and more preferred is diethylene glycol (hereinafter also referred to as "DEG").

The boiling point of the water-soluble organic solvent is preferably not lower than 100° C., and more preferably not lower than 200° C., from the viewpoints of attaining good safety and suppressing evaporation of the organic solvent upon kneading, whereas the solidification point of the water-soluble organic solvent is preferably not higher than 25° C., and more preferably not higher than 0° C., from the viewpoint of good workability.

[Water]

The mixture to be kneaded in the present invention also contains water in an amount of not less than 0.6 part by mass and not more than 4.0 parts by mass on the basis of 100 parts by mass of the water-soluble inorganic salt. It is considered that when blending not less than 0.6 part by mass of water in the mixture, the water-soluble inorganic salt acting as pulverization media can be enhanced in viscosity on the surface thereof, which results in enhanced pulverization efficiency. Also, it is considered that when blending not more than 4.0 parts by mass of water in the mixture, the water-soluble inorganic salt can maintain its shape and therefore can efficiently function as pulverization media.

The blending amount of water in the mixture to be kneaded is not less than 0.6 part by mass, preferably not less than 0.8 part by mass, more preferably not less than 1.1 parts by mass, even more preferably not less than 1.3 parts by mass, and further even more preferably not less than 1.5 parts by mass, on the basis of 100 parts by mass of the water-soluble inorganic salt, from the viewpoint of good pulverization efficiency. Also, from the same viewpoint as described above, the blending amount of water in the mixture to be kneaded is not more than 4.0 parts by mass, preferably not more than 3.2 parts by mass, more preferably not more than 2.7 parts by mass, even more preferably not more than 2.2 parts by mass, and further even more preferably not more than 1.7 parts by mass, on the basis of 100 parts by mass of the water-soluble inorganic salt.

The content of water in the mixture to be kneaded is not less than 0.6 part by mass, preferably not less than 0.8 part by mass, more preferably not less than 1.1 parts by mass, even more preferably not less than 1.3 parts by mass, and further even more preferably not less than 1.5 parts by mass, on the basis of 100 parts by mass of the water-soluble inorganic salt, from the viewpoint of good pulverization efficiency. Also, from the same viewpoint as described above, the content of water in the mixture to be kneaded is not more than 4.0 parts by mass, preferably not more than 3.2 parts by mass, more preferably not more than 2.7 parts by mass, even more preferably not more than 2.2 parts by mass, and further even more preferably not more than 1.7 parts by mass, on the basis of 100 parts by mass of the water-soluble inorganic salt.

The water blended in the mixture to be kneaded in the present invention is at least one water selected from the group consisting of tap water, ion-exchanged water, ground water and distilled water. Of these waters, from the viewpoint of maintaining good quality of the resulting fine organic pigment, preferred is ion-exchanged water.

In addition, the pH value of the water blended is, for example, from 4 to 7.5.

[Kneading Step (Step 1)]

The kneading step in the process of the present invention is the step 1 of kneading a mixture prepared by blending the raw material organic pigment, the water-soluble inorganic salt, the water-soluble organic solvent and water with each other, in which the water is blended in an amount of not less than 0.6 part by mass and not more than 4.0 parts by mass on the basis of 100 parts by mass of the water-soluble inorganic salt. The mixture obtained through the kneading step (hereinafter also referred to as a "kneaded mixture") contains a fine organic pigment having a small primary particle size.

The kneading step may be carried out using various kneading devices such as a batch type kneader or a continuous type kneader, or a kneader of a normal pressure type, an applied pressure type or a reduced pressure type. Examples of the kneading devices include roll mills such as a twin roll mill, a triple roll mill and a multiple roll mill; extruders such as a single-screw extruder and a twin-screw extruder; and stirring type kneaders such as a planetary mixer. As the stirring type kneader, there may be mentioned "TRIMIX" available from INOUE MFG., INC., and the like. Also, as the extruder, there may be mentioned "KRC Kneader" available from Kurimoto Ltd., "MIRACLE K.C.K." available from Asada Iron Works Co., Ltd., and the like.

The temperature of the mixture upon kneading is preferably not higher than 120° C., and more preferably not higher than 100° C., from the viewpoint of attaining good pulverization efficiency and suppressing evaporation of water, and is also preferably not lower than 20° C., and more preferably not lower than 40° C., from the viewpoint of reducing load for cooling.

The time of the kneading step is preferably not less than 0.5 h, more preferably not less than 1 h, and even more preferably not less than 2 h, from the viewpoint of facilitated atomization of the pigment, and is also preferably not more than 15 h, more preferably not more than 10 h, and even more preferably not more than 5 h, from the viewpoint of high productivity.

(Step 1-1 and Step 1-2)

The kneading step may be conducted, for example, by a method in which the raw material organic pigment, the water-soluble inorganic salt, the water-soluble organic solvent and water are filled in the aforementioned kneading device or the like, and kneaded together therein. From the viewpoint of attaining uniform compositional distribution of water in the mixture to be kneaded, the kneading step preferably includes the step of mixing the raw material organic pigment, the water-soluble inorganic salt and the water-soluble organic solvent with each other (hereinafter also referred to as "step 1-1"); and the step of kneading a mixture prepared by blending the mixture obtained in the step 1-1 and water (hereinafter also referred to as "step 1-2"). Form the viewpoint of good workability, the step 1-1 and the step 1-2 are more preferably carried out using the same kneading device.

The time of the step 1-1 is preferably not less than 1 min, more preferably not less than 5 min, and even more preferably not less than 20 min, from the viewpoint of attaining uniform compositional distribution of water in the mixture to be kneaded, and is also preferably not more than 1 h from the viewpoint of high productivity.

The time of the step 1-2 is preferably not less than 0.5 h, more preferably not less than 1 h, and even more preferably not less than 2 h, from the viewpoint of facilitated atomization of the pigment, and is also preferably not more than 15 h, more preferably not more than 10 h, even more preferably not more than 5 h, from the viewpoint of high productivity.

The blending amount of the water-soluble inorganic salt in the mixture to be kneaded is preferably not less than 100 parts by mass, more preferably not less than 300 parts by mass, and even more preferably not less than 400 parts by mass, on the basis of 100 parts by mass of the raw material organic pigment, from the viewpoint of good pulverization efficiency, and is also preferably not more than 3000 parts by mass, more preferably not more than 1000 parts by mass, and even more preferably not more than 800 parts by mass, on the basis of 100 parts by mass of the raw material organic pigment, from the viewpoint of high productivity.

The blending amount of the water-soluble organic solvent in the mixture to be kneaded is preferably not less than 10 parts by mass, more preferably not less than 50 parts by mass, and even more preferably not less than 100 parts by mass, on the basis of 100 parts by mass of the raw material organic pigment, from the viewpoint of good pulverization efficiency, and is also preferably not more than 500 parts by mass, more preferably not more than 300 parts by mass, and even more preferably not more than 200 parts by mass, on the basis of 100 parts by mass of the raw material organic pigment, from the same viewpoint as described above.

The blending amount of water in the mixture to be kneaded is preferably not less than 2.5 parts by mass, more preferably not less than 3.5 parts by mass, even more preferably not less than 5.0 parts by mass, and further even more preferably not less than 6.0 parts by mass, on the basis of 100 parts by mass of the water-soluble organic solvent, from the viewpoint of good pulverization efficiency, and is also preferably not more than 16 parts by mass, more preferably not more than 13 parts by mass, even more preferably not more than 10 parts by mass, and further even more preferably not more than 8.0 parts by mass, on the basis of 100 parts by mass of the water-soluble organic solvent, from the same viewpoint as described above.

The blending amount of water in the mixture to be kneaded is preferably not less than 3.0 parts by mass, more preferably not less than 5.0 parts by mass, even more preferably not less than 6.0 parts by mass, and further even more preferably not less than 7.0 parts by mass, on the basis of 100 parts by mass of the raw material organic pigment, from the viewpoint of good pulverization efficiency, and is also preferably not more than 20 parts by mass, more preferably not more than 15 parts by mass, even more preferably not more than 12 parts by mass, and further even more preferably not more than 9.0 parts by mass, on the basis of 100 parts by mass of the raw material organic pigment, from the same viewpoint as described above.

The blending amount of water in the mixture to be kneaded is preferably not less than 0.4 parts by mass, more preferably not less than 0.8 parts by mass, and even more preferably not less than 1.0 parts by mass, on the basis of 100 parts by mass of a total amount of the raw material organic pigment, the water-soluble inorganic salt and the water-soluble organic solvent, from the viewpoint of good pulverization efficiency, and is also preferably not more than 2.8 parts by mass, more preferably not more than 2.2 parts by mass, and even more preferably not more than 1.5 parts by mass, on the basis of 100 parts by mass of a total amount of the raw material organic pigment, the water-soluble inorganic salt and the water-soluble organic solvent, from the same viewpoint as described above.

(Step 1-3)

The process for producing a fine organic pigment according to the present invention preferably further includes the following step 1-3:

step 1-3: kneading the kneaded mixture obtained in the above step 1 or in the above step 1-1 and step 1-2, with a polymer.

In the step 1-3, an organic solvent may be further added.

The kneading conditions such as a kneading device and a kneading temperature used in the step 1-3 are preferably the same as those illustrated in the above step 1.

The kneading time in the step 1-3 is preferably not less than 0.25 h, more preferably not less than 0.5 h, and even more preferably not less than 0.75 h, form the viewpoint of good dispersibility of the pigment, and is also preferably not more than 5 h, more preferably not more than 3 h, and even more preferably not more than 2 h, from the viewpoint of high productivity.

(Polymer)

A polymer may be used in order to attain good dispersibility of the pigment. Examples of the polymer include polyesters, polyurethanes and vinyl polymers. Of these polymers, from the viewpoint of good storage stability of the resulting water dispersion, preferred are vinyl polymers, and more preferred are vinyl polymers obtained by addition-polymerizing at least one vinyl monomer selected from the group consisting of a vinyl compound, a vinylidene compound and a vinylene compound.

The polymer is preferably in the form of an anionic polymer from the viewpoint of good dispersibility. The term "anionic" as used herein means that an unneutralized substance has a pH value of less than 7 when dispersed or dissolved in pure water. Otherwise, if the substance is insoluble in pure water and therefore it is impossible to clearly measure a pH value thereof, the term "anionic" as used herein means that a dispersion prepared by dispersing the substance in pure water has a negative zeta potential.

The polymer used in the present invention is preferably a vinyl polymer that is produced by copolymerizing a monomer mixture containing (a) an anionic monomer (hereinafter also referred to merely as a "component (a)"), and (b) a hydrophobic monomer (hereinafter also referred to merely as a "component (b)") (such a mixture is hereinafter also referred to merely as a "monomer mixture").

The vinyl polymer preferably contains a constitutional unit derived from the component (a), and a constitutional unit derived from the component (b).

[Anionic Monomer: Component (a)]

The component (a) is preferably used as a monomer component constituting the polymer used in the present invention. It is considered that the constitutional unit derived from the component (a) is capable of stably dispersing the pigment in the water dispersion owing to electrostatic repulsion.

Examples of the component (a) include monomers containing an anionic group such as a carboxy group, a sulfo group, a phosphoric group and a phosphonic group. Of these monomers, from the viewpoint of good dispersion stability of the pigment, preferred are monomers containing a carboxy group, and more preferred is at least one monomer selected from the group consisting of acrylic acid and methacrylic acid.

[Hydrophobic Monomer: Component (b)]

The component (b) is preferably used as a monomer component constituting the polymer used in the present invention. It is considered that the constitutional unit derived from the component (b) is capable of promoting adsorption of the polymer onto the surface of the pigment and thereby contributing to good dispersion stability of the pigment.

The component (b) is preferably at least one monomer selected from the group consisting of an alkyl (meth)acrylate and an aromatic compound containing an ethylenic double bond (hereinafter also referred to as an "aromatic monomer"). Of these monomers, from the viewpoint of good dispersion stability of the pigment, preferred is the aromatic monomer.

The aromatic monomer is preferably at least one monomer selected from the group consisting of a styrene-based monomer and an aromatic group-containing (meth)acrylate from the viewpoint of facilitated production of the polymer.

The styrene-based monomer is more preferably styrene from the viewpoint of good availability.

The aromatic group-containing (meth)acrylate is more preferably benzyl (meth)acrylate from the viewpoint of good availability. The term "(meth)acrylate" as used in the present specification means at least one compound selected from the group consisting of an acrylate and a methacrylate.

[Other Monomer Components]

The monomer mixture may also contain, in addition to the above components (a) and (b), the other monomer components. Examples of the other monomer components include compounds represented by the following general formula (1), macromers containing a polymerizable functional group at one terminal end thereof and having a number-average molecular weight of 500 or more, etc.

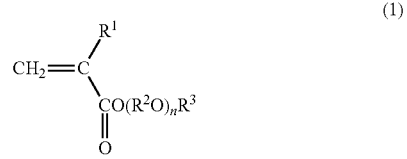

In the formula (1), $R^1$ is a hydrogen atom or a methyl group; $R^2$ is an alkanediyl group having 2 or 3 carbon atoms; n represents an average number of constitutional units represented by ($R^2O$), and is a number of not less than 1 and not more than 100; $R^3$ is a hydrogen atom or a hydrocarbon group having 1 to 24 carbon atoms.

Examples of commercially available products of the macromers include "AS-6(S)", "AN-6(S)" and "HS-6(S)" available from from Toagosei Co., Ltd., etc.

The above components (a) and (b) and other monomer components may be respectively used alone or in combination of any two or more thereof.

The preferred contents of the respective constitutional units derived from the components (a) and (b) in the polymer are as follows.

The content of the constitutional unit derived from the component (a) in the polymer is preferably not less than 2% by mass, and more preferably not less than 10% by mass, and is also preferably not more than 40% by mass, and more preferably not more than 30% by mass, from the viewpoint of good storage stability of the resulting ink.

The content of the constitutional unit derived from the component (b) in the polymer is preferably not less than 40% by mass, and more preferably not less than 60% by mass, and is also preferably not more than 98% by mass, and more preferably not more than 85% by mass, from the viewpoint of enhancing optical density of the resulting ink.

(Production of Polymer)

The polymer used in the present invention may be produced, for example, by copolymerizing the monomer mixture by known methods. The preferred contents of the components (a) and (b) in the monomer mixture are the same as the preferred contents of the respective constitutional units derived from the components (a) and (b) in the aforementioned polymer.

As the polymerization method, preferred is a solution polymerization. The solvent used in the solution polymerization method is preferably at least one solvent selected from the group consisting of ketones, alcohols, ethers and esters which have not less than 4 and not more than 8 carbon atoms, more preferably ketones having not less than 4 and not more than 8 carbon atoms, and even more preferably methyl ethyl ketone (hereinafter also referred to as "MEK") from the viewpoints of facilitated production of the polymer and good dispersibility of the pigment.

The polymerization may be carried out in the presence of a conventionally known polymerization initiator or a conventionally known chain transfer agent. The polymerization initiator is preferably an azo compound, and more preferably 2,2'-azobis(2,4-dimethylvaleronitrile), and the chain transfer agent is preferably mercaptans, and more preferably 2-mercapto ethanol.

The preferred polymerization conditions may vary depending upon the kinds of polymerization initiator, monomers, solvent, etc., to be used. The polymerization temperature is preferably not lower than 50° C. and not higher than 80° C., and the polymerization time is preferably not less than 1 h and not more than 20 h. The polymerization is preferably conducted in an atmosphere of an inert gas such as nitrogen gas and argon.

After completion of the polymerization reaction, the polymer thus produced may be isolated from the reaction solution by a known method such as reprecipitation, removal of solvent by distillation or the like. The thus obtained polymer may be subjected to reprecipitation, membrane separation, chromatography, extraction, etc., for removing unreacted monomers, etc., therefrom.

The weight-average molecular weight of the polymer is preferably not less than 5,000, and more preferably not less than 10,000, and is also preferably not more than 500,000, more preferably not more than 400,000, even more preferably not more than 300,000, and further even more preferably not more than 200,000, from the viewpoint of good dispersion stability of the pigment.

Examples of commercially available products of the polymer include "JONCRYL" series including "67", "68", "678", "680", "682", "683", "690" and "819" all available from BASF Japan, Ltd., etc.

(Neutralizing Agent)

In the present invention, in the case where the polymer contains an anionic group, the anionic group may be neutralized with a neutralizing agent. Examples of the neutralizing agent used for the neutralization include bases such as lithium hydroxide, sodium hydroxide, potassium hydroxide, ammonia and various amines.

The degree of neutralization of the polymer is preferably not less than 10 mol %, more preferably not less than 20 mol %, and even more preferably not less than 30 mol %, from the viewpoint of good dispersion stability of the pigment, and is also preferably not more than 90 mol %, more preferably not more than 80 mol %, and even more preferably not more than 70 mol %, from the viewpoint of good dispersibility of the pigment.

The degree of neutralization of the polymer is calculated according to the following formula:

Degree of neutralization (mol %)={[mass (g) of neutralizing agent/gram equivalent of neutralizing agent]/[acid value (mgKOH/g) of polymer× mass (g) of polymer/(56×1000)]}×100.

The acid value of the polymer may be calculated from the ratio between the monomer components used upon production of the polymer, or may also be determined by the method of subjecting a solution prepared by dissolving the polymer in a solvent such as MEK in which the polymer can be dissolved, to titration with an alkaline agent.

Examples of the preferred organic solvent used in the step 1-3 include those illustrated above as the water-soluble organic solvent used in the step 1.

The content of the organic pigment in the mixture to be kneaded in the step 1-3 is preferably not less than 5% by mass, and more preferably not less than 10% by mass, and is also preferably not more than 50% by mass, and more preferably not more than 40% by mass.

The content of the polymer in the mixture used in the step 1-3 is preferably not less than 10 parts by mass, and more preferably not less than 20 parts by mass, on the basis of 100 parts by mass of the organic pigment, from the viewpoint of good dispersion stability, and is also preferably not more than 100 parts by mass, and more preferably not more than 60 parts by mass, on the basis of 100 parts by mass of the organic pigment, from the same viewpoint as described above.

The content of the organic solvent in the mixture used in the step 1-3 is preferably not less than 10 parts by mass, more preferably not less than 50 parts by mass, and even more preferably not less than 100 parts by mass, on the basis of 100 parts by mass of the organic pigment, from the viewpoint of good processing efficiency, and is also preferably not more than 500 parts by mass, more preferably not more than 300 parts by mass, and even more preferably not more than 250 parts by mass, on the basis of 100 parts by mass of the organic pigment, from the same viewpoint as described above.

[Cleaning Step (Step 2)]

From the viewpoint of facilitated removal of the water-soluble inorganic salt and water-soluble organic solvent from the kneaded mixture, the process for producing a fine organic pigment according to the present invention preferably includes the step of cleaning the kneaded mixture (hereinafter also referred to as "cleaning step" or "step 2").

The cleaning step may be performed, for example, by the following method. That is, the kneaded mixture is stirred and mixed with an aqueous solvent such as water which is used in an amount enough to dissolve the water-soluble inorganic salt and water-soluble organic solvent contained in the kneaded mixture, thereby obtaining a dispersion of the pigment. Next, the resulting dispersion is subjected to filtration, and the obtained wet cake is cleaned with the aqueous solvent to thereby obtain a paste of a fine organic pigment from which the water-soluble inorganic salt and water-soluble organic solvent are removed (hereinafter also referred to merely as a "pigment paste").

The aqueous solvent used in the cleaning step is preferably water, and more preferably at least one water selected from the group consisting of tap water, ion-exchanged water, distilled water, ground water, and a mineral acid aqueous solution, from the viewpoint of good cleanability. The aqueous solvent used in the cleaning step is even more preferably ion-exchanged water, from the viewpoint of maintaining good quality of the resulting fine organic pigment, and further even more preferably ground water and a mineral acid aqueous solution, from the viewpoint of good economy.

(Drying Step (Step 2-2))

The pigment paste obtained through the cleaning step is further subjected to drying and pulverization, thereby obtaining the fine organic pigment in the form of a powder.

[Fine Organic Pigment]

The fine organic pigment obtained by the production process of the present invention may be either the pigment paste obtained in the above step 2, or the powdery fine organic pigment obtained through the above drying step.

The fine organic pigment obtained by the production process of the present invention includes, for example, the pigment derived from the above raw material organic pigment and a pigment derivative optionally added thereto. In addition, the fine organic pigment has a smaller primary particle size than that of the raw material organic pigment. For example, the ratio of the primary particle size of the fine organic pigment to the primary particle size of the raw material organic pigment (primary particle size of fine organic pigment/primary particle size of raw material organic pigment) is preferably not more than 0.8, more preferably not more than 0.6, even more preferably not more than 0.57, and further even more preferably not more than 0.54, and from the viewpoint of good working efficiency, the ratio is also preferably not less than 0.01, more preferably not less than 0.1, and even more preferably not less than 0.2.

The primary particle size of the fine organic pigment may vary depending upon the kind and applications of the pigment. For example, the primary particle size of the fine organic pigment is preferably not less than 10 nm, more preferably not less than 20 nm, and even more preferably not less than 30 nm, and is also preferably not more than 130 nm, more preferably not more than 60 nm, even more preferably not more than 55 nm, further even more preferably not more than 52 nm, and further even more preferably not more than 49 nm.

In addition, the primary particle size of the fine organic pigment may be suitably controlled by appropriately selecting the raw material organic pigment and adjusting amounts of the respective components blended in the mixture to be kneaded and the kneading conditions such as kneading time.

Meanwhile, the primary particle size of the fine organic pigment may be measured by the method described in Examples below.

The fine organic pigment obtained by the production process of the present invention may be suitably used in the applications such as inks for ink-jet printing and color filters, as well as in the applications such as printing inks other than those for ink-jet printing, paints, colored resin molded articles and toners for development of electrostatic latent images. Of these applications, the fine organic pigment of the present invention is preferably used for ink-jet printing. The ink-jet printing method may be, for example, such a method in which droplets of ink are projected from nozzles and allowed to adhere onto a recording medium to obtain printed matters on which characters or images are printed.

[Production of Dispersion]

The dispersion of the present invention is produced using the above fine organic pigment.

The dispersion may be efficiently produced, for example, by the process including the step of dispersing a mixture containing the fine organic pigment and a solvent.

(Step 3)

Also, the dispersion is preferably efficiently produced by the process including the following step 3.

step 3: subjecting the above paste of the fine organic pigment, an organic solvent and water to dispersing treatment.

In the above step 3, a polymer or a dispersant may be added, if required, and furthermore a neutralizing agent, a crosslinking agent, etc., may also be added.

As the dispersant, there may be mentioned at least one material selected from the group consisting of a surfactant, a (meth)acrylic acid-based (co)polymer, an aliphatic hydroxycarboxylic acid residue-containing polyester-based oligomer, an organosiloxane polymer and a basic urethane resin. As the preferred polymer and neutralizing agent, there may be used those illustrated in the aforementioned step 1-3.

(Solvent)

Examples of the solvent include water and an organic solvent.

Specific examples of the water include tap water, ion-exchanged water and distilled water. Of these waters, preferred is ion-exchanged water.

Specific examples of the organic solvent include ketone solvents such as acetone, MEK, methyl isobutyl ketone and diethyl ketone; alcohol solvents such as methanol, ethanol, propanol and butanol; ether solvents such as dibutyl ether, tetrahydrofuran, dioxane, propylene glycol monomethyl ether acetate (hereinafter also referred to as "PGMEA") and diethylene glycol monobutyl ether acetate (hereinafter also referred to as "BCA"); and ester solvents such as ethyl acetate and butyl acetate. Of these organic solvents, preferred are acetone, MEK and PGMEA.

In the above step 3, there are used the organic solvent and water. The organic solvent is preferably a ketone solvent, and more preferably MEK.

(Crosslinking Agent)

In the present invention, in order to enhance storage stability of the dispersion and ink, the polymer may be crosslinked with a crosslinking agent containing two or more reactive functional groups in a molecule thereof. Examples of the crosslinking agent include compounds containing two or more epoxy groups in a molecule thereof, such as ethylene glycol diglycidyl ether.

The method of dispersing the mixture may be selected from optional methods. Preferably, the mixture is first subjected to a preliminary dispersion treatment, and then to substantial dispersion treatment by applying a shear stress thereto, from the viewpoint of well controlling the average particle size of the obtained pigment particles to a desired value.

Upon subjecting the mixture to the preliminary dispersion treatment, there may be used ordinary mixing or stirring devices such as anchor blades and disper blades. Specific examples of the preferred mixing or stirring devices include high-speed stirring mixers such as "Ultra Disper", "Dispamill" available from Asada Iron Works Co., Ltd., "Milder" available from Ebara Corporation, "Milder" available from Pacific Machinery & Engineering Co., Ltd., and "TK Homomixer", "TK Pipeline Mixer", "TK Homo Jetter", "TK Homomic Line Flow" and "Filmix" all available from Primix Co., Ltd.

As a means for applying a shear stress to the mixture in the substantial dispersion treatment, there may be used, for example, kneading machines such as roll mills, kneaders and extruders, homo-valve-type high-pressure homogenizers such as typically "High-Pressure Homogenizer" available from Izumi Food Machinery Co., Ltd., chamber-type high-pressure homogenizers such as "MICROFLUIDIZER" available from Microfluidics Corp., "Nanomizer" available from Yoshida Kikai Kogyo Co., Ltd., and "Ultimizer" and ""Starburst" both available from Sugino Machine Ltd., and media type dispersers such as a paint shaker and a beads mill. Examples of commercially available products of the media type dispersers include "Ultra Apex Mill" available from Kotobuki Industries Co., Ltd., "Pico Mill" available from Asada Iron Works Co., Ltd., and "Dainomill" available from Shinmaru Enterprise Corp. These apparatuses may be used in combination of any two or more thereof. Among these apparatuses, the high-pressure homogenizers and the media type dispersers are preferably used from the viewpoints of reducing a particle size of the pigment particles and stabilizing the dispersion.

The dispersing treatment in the step 3 is preferably conducted using the high-pressure homogenizers.

The temperature upon the dispersion treatment is preferably not lower than 5° C., and is also preferably not higher than 50° C., and more preferably not higher than 35° C., from the viewpoint of attaining high dispersibility of the pigment.

The dispersing time is preferably not less than 1 h, and is also preferably not more than 30 h, and more preferably not more than 25 h, from the viewpoint of attaining high dispersibility of the pigment.

When using the high-pressure homogenizer in the step 3, the treating pressure of the dispersing treatment is preferably not less than 50 MPa, more preferably not less than 100 MPa, and even more preferably not less than 120 MPa, and is also preferably not more than 600 MPa, more preferably not more than 300 MPa, and even more preferably not more than 200 MPa.

When using the high-pressure homogenizer in the step 3, the number of passes through the homogenizer is preferably not less than 3, more preferably not less than 5, and even more preferably not less than 10, and is also preferably not more than 60, more preferably not more than 40, and even more preferably not more than 30.

The content of the fine organic pigment in the dispersion is preferably not less than 5% by mass, and more preferably not less than 10% by mass, and is also preferably not more than 50% by mass, and more preferably not more than 40% by mass.

The content of the dispersant in the dispersion is preferably not less than 2% by mass, and more preferably not less than 3% by mass, and is also preferably not more than 40% by mass, and more preferably not more than 20% by mass.

The content of the solvent in the dispersion is preferably not less than 10% by mass, and is also preferably not more than 90% by mass, more preferably not more than 70% by mass, and even more preferably not more than 50% by mass.

The dispersion thus prepared using water may be blended with the water-soluble organic solvent and, if required, ordinary additives such as a wetting agent, and may be used as a water-based ink.

When the dispersion is prepared using an organic solvent, the resulting dispersion may be used as a coloring composition for color filters (color resist) and a raw material thereof.

[Production of Ink (Step 4)]

The process for producing an ink according to the present invention include the following step 4.

step 4: mixing the dispersion obtained by the above process with at least one material selected from the group consisting of water and an organic solvent.

By conducting the step 4, it is possible to obtain a water-based ink having desired ink properties such as concentration and viscosity.

Examples of the organic solvent used in the step 4 include polyhydric alcohols, polyhydric alcohol alkyl ethers, polyhydric alcohol alkyl ether acetates and nitrogen-containing heterocyclic compounds.

Specific examples of the polyhydric alcohols include DEG, propylene glycol, 1,2-hexanediol, 1,3-hexanediol, 1,6-hexanediol, triethylene glycol and glycerol. Of these polyhydric alcohols, preferred is at least one compound selected from the group consisting of glycerol, propylene glycol and DEG.

Specific examples of the polyhydric alcohol alkyl ethers include diethylene glycol monoalkyl ethers and triethylene glycol monoalkyl ethers. Of these compounds, preferred is triethylene glycol monobutyl ether.

Specific examples of the polyhydric alcohol alkyl ether acetates include PGMEA and BCA.

Specific examples of the nitrogen-containing heterocyclic compounds include N-methyl-2-pyrrolidone and 2-pyrrolidone.

These organic solvents may be used alone or in combination of any two or more thereof.

In the step 4, in addition to the aforementioned water and organic solvent, various additives such as a humectant, a wetting agent, a penetrant, a dispersant, a surfactant, a viscosity modifier, a defoaming agent, an antiseptic agent, a mildew-proofing agent and a rust preventive may be mixed in the dispersion.

The solid content of the ink obtained by the production process of the present invention is preferably not less than 1% by mass, more preferably not less than 2% by mass, and even more preferably not less than 3% by mass, from the viewpoint of obtaining an ink with a high concentration, and is also preferably not more than 30% by mass, more preferably not more than 20% by mass, and even more preferably not more than 15% by mass, from the viewpoint of good dispersion stability of the ink.

With respect to the aforementioned embodiments, the present invention further provides the following aspects relating to the process for producing a fine organic pigment, the fine organic pigment, the dispersion, etc.

<1> A process for producing a fine organic pigment, including step 1 of kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water-soluble inorganic salt.

<2> The process according to the aspect <1>, wherein the raw material organic pigment is preferably at least one pigment selected from the group consisting of quinacridone pigments, quinophthalone pigments, diketopyrrolopyrrole pigments and phthalocyanine pigments.

<3> The process according to the aspect <1> or <2>, wherein a primary particle size of the raw material organic pigment is preferably not more than 500 nm, more preferably not more than 200 nm and even more preferably not more than 100 nm, and is also, for example, not less than 60 nm.

<4> The process according to any one of the aspects <1> to <3>, wherein the water-soluble inorganic salt is preferably at least one compound selected from the group consisting of an alkali metal chloride and an alkali metal sulfate, and more preferably an alkali metal chloride.

<5> The process according to any one of the aspects <1> to <4>, wherein the water-soluble inorganic salt is preferably at least one compound selected from the group consisting of sodium chloride, potassium chloride, sodium sulfate, zinc chloride, calcium chloride and magnesium chloride, more preferably at least one compound selected from the group consisting of sodium chloride and sodium sulfate, and even more preferably sodium chloride.

<6> The process according to any one of the aspects <1> to <5>, wherein a solubility of the water-soluble inorganic salt in 100 g of water as measured at 20° C. is preferably not less than 10 g, more preferably not less than 20 g, and even more preferably not less than 30 g, and is also preferably not more than 100 g, more preferably not more than 60 g, and even more preferably not more than 40 g.

<7> The process according to any one of the aspects <1> to <6>, wherein the water-soluble inorganic salt is preferably hardly soluble in the water-soluble organic solvent, and more preferably substantially insoluble in the water-soluble organic solvent.

<8> The process according to any one of the aspects <1> to <7>, wherein a solubility of the water-soluble inorganic salt in 100 g of the water-soluble organic solvent as measured at 20° C. is preferably not more than 10 g, and more preferably not more than 1 g.

<9> The process according to any one of the aspects <1> to <8>, wherein the water-soluble inorganic salt is preferably in the form of particles, and an average particle size of the water-soluble inorganic salt is preferably not more than 1000 µm, more preferably not more than 700 µm, even more preferably not more than 400 µm, further even more preferably not more than 200 µm, further even more preferably not more than 50 µm, and further even more preferably not more than 20 µm, and is also preferably not less than 0.1 µm, more preferably not less than 1 µm, and even more preferably not less than 5 µm.

<10> The process according to any one of the aspects <1> to <9>, wherein the water-soluble organic solvent is preferably a glycol-based compound or glycerol, and more preferably diethylene glycol.

<11> The process according to any one of the aspects <1> to <10>, wherein a blending amount of water is not less than 0.6 part by mass, preferably not less than 0.8 part by mass, more preferably not less than 1.1 parts by mass, even more preferably not less than 1.3 parts by mass, and further even more preferably not less than 1.5 parts by mass, and is also not more than 4.0 parts by mass, preferably not more than 3.2 parts by mass, more preferably not more than 2.7 parts by mass, even more preferably not more than 2.2 parts by mass, and further even more preferably not more than 1.7 parts by mass, on the basis of 100 parts by mass of the water-soluble inorganic salt.

<12> The process according to any one of the aspects <1> to <11>, wherein a content of water is not less than 0.6 part by mass, preferably not less than 0.8 part by mass, more preferably not less than 1.1 parts by mass, even more preferably not less than 1.3 parts by mass, and further even more preferably not less than 1.5 parts by mass, and is also not more than 4.0 parts by mass, preferably not more than 3.2 parts by mass, more preferably not more than 2.7 parts by mass, even more preferably not more than 2.2 parts by mass, and further even more preferably not more than 1.7 parts by mass, on the basis of 100 parts by mass of the water-soluble inorganic salt.

<13> The process according to any one of the aspects <1> to <12>, wherein water blended is preferably at least one water selected from the group consisting of tap water, ion-exchanged water, ground water and distilled water, and more preferably ion-exchanged water.

<14> The process according to any one of the aspects <1> to <13>, wherein the kneading step preferably includes the following steps 1-1 and 1-2:
step 1-1: mixing the raw material organic pigment, the water-soluble inorganic salt and the water-soluble organic solvent with each other; and
step 1-2: kneading a mixture prepared by blending the mixture obtained in the step 1-1 and water.

<15> The process according to any one of the aspects <1> to <14>, wherein a blending amount of the water-soluble inorganic salt is preferably not less than 100 parts by mass, more preferably not less than 300 parts by mass, and even more preferably not less than 400 parts by mass, and is also preferably not more than 3000 parts by mass, more preferably not more than 1000 parts by mass, and even more preferably not more than 800 parts by mass, on the basis of 100 parts by mass of the raw material organic pigment.

<16> The process according to any one of the aspects <1> to <15>, wherein a blending amount of the water-soluble organic solvent is preferably not less than 10 parts by mass, more preferably not less than 50 parts by mass, and even more preferably not less than 100 parts by mass, and is also preferably not more than 500 parts by mass, more preferably not more than 300 parts by mass, and even more preferably not more than 200 parts by mass, on the basis of 100 parts by mass of the raw material organic pigment.

<17> The process according to any one of the aspects <1> to <16>, wherein a blending amount of water is preferably not less than 2.5 parts by mass, more preferably not less than 3.5 parts by mass, even more preferably not less than 5.0 parts by mass, and further even more preferably not less than 6.0 parts by mass, and is also preferably not more than 16 parts by mass, more preferably not more than 13 parts by mass, even more preferably not more than 10 parts by mass, and further even more preferably not more than 8.0 parts by mass, from the same viewpoint, on the basis of 100 parts by mass of the water-soluble organic solvent.

<18> The process according to any one of the aspects <1> to <17>, wherein a blending amount of water is preferably not less than 3.0 parts by mass, more preferably not less than 5.0 parts by mass, even more preferably not less than 6.0 parts by mass, and further even more preferably not less than 7.0 parts by mass, and is also preferably not more than 20 parts by mass, more preferably not more than 15 parts by mass, even more preferably not more than 12 parts by mass, and further even more preferably not more than 9.0 parts by mass, from the same viewpoint, on the basis of 100 parts by mass of the raw material organic pigment.

<19> The process according to any one of the aspects <1> to <18>, wherein a blending amount of water is preferably not less than 0.4 parts by mass, more preferably not less than 0.8 parts by mass, and even more preferably not less than 1.0 parts by mass, and is also preferably not more than 2.8 parts by mass, more preferably not more than 2.2 parts by mass, and even more preferably not more than 1.5 parts by mass, from the same viewpoint, on the basis of 100 parts by mass of a total amount of the raw material organic pigment, the water-soluble inorganic salt and the water-soluble organic solvent.

<20> The process according to any one of the aspects <1> to <19>, preferably further including the following step 1-3:
step 1-3: kneading the kneaded mixture obtained in the step 1 or in the step 1-1 and step 1-2, with a polymer.

<21> The process according to the aspect <20>, wherein the polymer is preferably an anionic polymer.

<22> The process according to the aspect <20> or <21>, wherein the polymer is preferably a vinyl polymer that is produced by copolymerizing a monomer mixture containing (a) an anionic monomer and (b) a hydrophobic monomer.

<23> The process according to any one of the aspects <20> to <22>, wherein a weight-average molecular weight of the polymer is preferably not less than 5,000, and more preferably not less than 10,000, and is also preferably not more than 500,000, more preferably not more than 400,000, even more preferably not more than 300,000, and further even more preferably not more than 200,000.

<24> The process according to any one of the aspects <20> to <23>, wherein a content of the organic pigment in the mixture to be kneaded in the step 1-3 is preferably not less than 5% by mass, and more preferably not less than 10% by mass, and is also preferably not more than 50% by mass, and more preferably not more than 40% by mass.

<25> The process according to any one of the aspects <20> to <24>, wherein a content of the polymer in the mixture used in the step 1-3 is preferably not less than 10 parts by mass, and more preferably not less than 20 parts by mass, and is also preferably not more than 100 parts by mass, and more preferably not more than 60 parts by mass, on the basis of 100 parts by mass of the organic pigment.

<26> The process according to any one of the aspects <20> to <25>, wherein a content of the organic solvent in the mixture used in the step 1-3 is preferably not less than 10 parts by mass, more preferably not less than 50 parts by mass, and even more preferably not less than 100 parts by mass, and is also preferably not more than 500 parts by mass, more preferably not more than 300 parts by mass, and even more preferably not more than 250 parts by mass, on the basis of 100 parts by mass of the organic pigment.

<27> A process for producing a paste of a fine organic pigment, including the following steps 1 and 2:
step 1: kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water-soluble inorganic salt; and
step 2: cleaning the kneaded mixture obtained in the step 1.

<28> The process for producing a paste of a fine organic pigment according to the aspect <27>, preferably further including the following step 1-3:
step 1-3: kneading the kneaded mixture obtained in the step 1 with a polymer,
wherein the step 2 is a step of cleaning the kneaded mixture obtained in the step 1-3.

<29> A process for producing a powdery fine organic pigment, including the following steps 1, 2 and 2-2:

step 1: kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water-soluble inorganic salt;

step 2: cleaning the kneaded mixture obtained in the step 1 to obtain a paste of a fine organic pigment; and step 2-2: further subjecting the paste of the fine organic pigment obtained through the step 2 to drying and pulverization to thereby obtain the powdery fine organic pigment.

<30> The process according to any one of the aspects <1> to <29>, wherein a ratio of a primary particle size of the fine organic pigment to a primary particle size of the raw material organic pigment (primary particle size of fine organic pigment/primary particle size of raw material organic pigment) is preferably not more than 0.8, more preferably not more than 0.6, even more preferably not more than 0.57, and further even more preferably not more than 0.54, and is also preferably not less than 0.01, more preferably not less than 0.1, and even more preferably not less than 0.2.

<31> The process according to any one of the aspects <1> to <30>, wherein the primary particle size of the fine organic pigment is preferably not less than 10 nm, more preferably not less than 20 nm, and even more preferably not less than 30 nm, and is also preferably not more than 130 nm, more preferably not more than 60 nm, even more preferably not more than 55 nm, further even more preferably not more than 52 nm, and further even more preferably not more than 49 nm.

<32> A process for producing a dispersion, including the step of dispersing a mixture containing the fine organic pigment produced by the process according to any one of the aspects <1> to <31> and a solvent.

<33> A process for producing a dispersion, including the following step 3:

step 3: subjecting the paste of the fine organic pigment produced by the process according to the aspect <27> or <28>, an organic solvent and water to dispersing treatment.

<34> A process for producing a dispersion, including the following steps 1 to 3:

step 1: kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water-soluble inorganic salt;

step 2: cleaning the kneaded mixture obtained in the step 1 to obtain a paste of a fine organic pigment; and step 3: subjecting the paste of the fine organic pigment obtained in the step 2, an organic solvent and water to dispersing treatment.

<35> The process according to the aspect <33> or <34>, wherein the organic solvent used in the step 3 is preferably at least one solvent selected from the group consisting of acetone, methyl ethyl ketone and propylene glycol monomethyl ether acetate.

<36> The process according to any one of the aspects <33> to <35>, wherein the dispersing treatment is preferably carried out using a high-pressure homogenizer.

<37> The process according to the aspect <36>, wherein a treating pressure of the dispersing treatment is preferably not less than 50 MPa, more preferably not less than 100 MPa, and even more preferably not less than 120 MPa, and is also preferably not more than 600 MPa, more preferably not more than 300 MPa, and even more preferably not more than 200 MPa.

<38> The process according to the aspect <36> or <37>, wherein the number of passes through the homogenizer is preferably not less than 3, more preferably not less than 5, and even more preferably not less than 10, and is also preferably not more than 60, more preferably not more than 40, and even more preferably not more than 30.

<39> A process for producing an ink, including the following step 4:

step 4: mixing the dispersion produced by the process according to any one of the aspects <36> to <38> with at least one material selected from the group consisting of water and an organic solvent.

<40> A process for producing an ink, including the following steps 1 to 4:

step 1: kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water-soluble inorganic salt;

step 2: cleaning the kneaded mixture obtained in the step 1 to obtain a paste of a fine organic pigment;

step 3: subjecting the paste of the fine organic pigment obtained in the step 2, an organic solvent and water to dispersing treatment to obtain a dispersion; and step 4: mixing the dispersion obtained in the step 3 with at least one material selected from the group consisting of water and an organic solvent.

<41> The process according to the aspect <40>, wherein the organic solvent used in the step 4 is preferably at least one solvent selected from the group consisting of polyhydric alcohols, polyhydric alcohol alkyl ethers, polyhydric alcohol alkyl ether acetates and nitrogen-containing heterocyclic compounds.

<42> The process according to any one of the aspects <39> to <41>, wherein a solid content of the resulting ink is preferably not less than 1% by mass, more preferably not less than 2% by mass, and even more preferably not less than 3% by mass, and is also preferably not more than 30% by mass, more preferably not more than 20% by mass, and even more preferably not more than 15% by mass.

<43> A fine organic pigment produced by the process according to any one of the aspects <1> to <31>.

<44> A dispersion produced by the process according to any one of the aspects <32> to <38>.

<45> An ink produced by the process according to any one of the aspects <39> to <42>.

EXAMPLES

In the following Examples, etc., various numerical values were measured and evaluated by the following methods.

(1) Measurement of Primary Particle Size of Pigment

A dispersion obtained by adding 0.05 g of pigment powder to 50 g of ethanol was treated using an ultrasonic cleaner "AU-16C" available from Aiwa Medical Industry Co., Ltd., for 5 min. The resulting pigment dispersion was placed on a sampling table for a transmission electron microscope (TEM) and air-dried, and then photographed by TEM at a magnification of 1 to 100,000 times to obtain a micrograph image. From the obtained image, about 500 pigment particles were randomly sampled, and all of the thus sampled particles were measured for their major axis diameters to calculate an average value of the measured diameters which was defined as a primary particle size of the pigment.

(2) Measurement of Solid Content

A petri dish was charged with 10 g of dried anhydrous sodium sulfate and fitted with a glass bar, and 1 g of a sample was weighed and added thereto, and the contents of the petri dish were mixed by the glass bar and then dried at 105° C. for 2 h. The mass of the contents of the petri dish after being dried was measured to calculate a solid content of the sample according to the following formula.

Solid content (% by mass)=[(mass (g) after being dried)−(total mass (g) of petri dish, glass bar and dried anhydrous sodium sulfate)]/(mass (g) of sample)×100

(3) Measurement of Average Particle Size of Ink

The average particle size of particles in the ink was measured by using a laser particle analyzing system "ELS-8000" available from Otsuka Electronics Co., Ltd., by cumulant analysis (temperature: 25° C.; angle between incident light and detector: 90° ; cumulative number: 100 times; refractive index of dispersing solvent: 1.333). The measurement was conducted by adjusting a concentration of a sample to be measured to about $5\times10^{-3}$% by mass using ion-exchanged water.

(4) Measurement of Gloss

Solid image printing was carried out on a printing paper ("PHOTO PAPER<GLOSSY>KA450PSK" available from Seiko Epson Corporation; 60° gloss: 41) using a piezoelectric type printer ("PX-A650" available from Seiko Epson Corporation) under the following printing conditions:

Kind of Paper: Photo printing paper; and
Mode set: Photo.

After allowing the printed paper to stand at 25° C. for 24 h, the 20° gloss value of the resulting printed image was measured 5 times using a gloss meter ("HANDY GLOSS-METER, PG-1" available from Nippon Denshoku Industries Co., Ltd.), and an average value of the thus measured gloss values was calculated and defined as a gloss of a sample measured. The higher the thus measured gloss value, the more excellent the glossiness of the sample.

Examples 1 to 9 and Comparative Examples 1 to 5

(Kneading Step)

The raw material organic pigment, water-soluble inorganic salt and water-soluble organic solvent as shown in Table 1 were kneaded together using a dispersion kneader "TD0.5-3M Model" available from Toshin Co., Ltd., without application of a pressure thereto at a rotating speed of 30 r/min for 0.5 h while maintaining the contents of the kneader at a temperature of from 40 to 60° C. Further, ion-exchanged water was added in such an amount as shown in Table 1 to the kneader, and the contents of the kneader were kneaded under the same conditions as described above for 3.0 h.

(Cleaning Step)

The resulting mixture was added to 3000 g of water and stirred for 1 h. The resulting dispersion was fed under a pressure of 0. 2 MPa into a chamber (filter chamber capacity: 763 cm$^3$; filtration area: 513 cm$^2$) of a filter press (Yabuta-type filter press) "ROUND TESTER YTO-8 Model" available from Yabuta Kikai Co., Ltd. Next, 50 of water was fed under a pressure of 0.2 MPa into the chamber to remove the water-soluble inorganic salt and water-soluble organic solvent therefrom, and further the resulting material was pressed under a pressure of 0.4 MPa to thereby obtain a pigment paste.

(Drying Step)

The resulting pigment paste was dried at 70° C. for 24 h, and pulverized in an agate mortar to obtain a powder of a fine organic pigment.

Meanwhile, the raw material organic pigments, water-soluble inorganic salts and water-soluble organic solvents used in the respective Examples and Comparative Examples as shown in Table 1 as well as properties thereof are as follows.

[(A) Raw Material Organic Pigment]
A-1: PR122 (2,9-dimethyl quinacridone; "CFR002" available from Dainichiseika Color & Chemicals Mfg. Co., Ltd.; primary particle size: 91 nm)
A-2: PB15:3 (phthalocyanine blue; "Heuco Blue 515303" available from Heubach Color Limited; primary particle size: 95 nm)
A-3: PR254 (diketopyrrolopyrrole; "B-CF" available from BASF; primary particle size: 79 nm)

[(B) Water-Soluble Inorganic Salt]
B-1: Sodium chloride ("OSHIO MICRON T-0" available from Ako Kasei Co., Ltd.; average particle size: 10 μm)
B-2: Sodium chloride ("Guaranteed Sodium Chloride (reagent)" available from Kishida Chemical Co., Ltd.; average particle size: about 500 μm)

[(C) Water-Soluble Organic Solvent]
C-1: Diethylene glycol (reagent "Guaranteed" available from Wako Pure Chemical Industries, Ltd.)
C-2: Polyethylene glycol 600 (reagent "First Grade" available from Sigma-Aldrich Japan K.K.)

TABLE 1

| | (A) Raw material organic pigment | | (B) Water-soluble inorganic salt | | (C) Water-soluble organic solvent | | (D) Water | | Fine organic pigment |
| | | | | | | | Parts by mass/ | Primary |
| | Kind | Blending Amount (g) | Kind | Blending Amount (g) | Kind | Blending Amount (g) | Blending Amount (g) | (B) 100 parts by mass | particle size (nm) |
|---|---|---|---|---|---|---|---|---|---|
| Comparative Example 1 | A-1 | 128 | B-1 | 638 | C-1 | 157 | 0.0 | 0.0 | 56 |
| Example 1 | A-1 | 128 | B-1 | 638 | C-1 | 157 | 4.0 | 0.6 | 50 |
| Example 2 | A-1 | 128 | B-1 | 638 | C-1 | 157 | 7.5 | 1.2 | 49 |
| Example 3 | A-1 | 128 | B-1 | 638 | C-1 | 157 | 10.2 | 1.6 | 48 |
| Example 4 | A-1 | 128 | B-1 | 638 | C-1 | 157 | 17.7 | 2.8 | 49 |
| Example 5 | A-1 | 128 | B-1 | 638 | C-1 | 157 | 23.0 | 3.6 | 53 |
| Comparative | A-1 | 128 | B-1 | 638 | C-1 | 157 | 28.7 | 4.5 | 58 |

TABLE 1-continued

| | (A) Raw material organic pigment | | (B) Water-soluble inorganic salt | | (C) Water-soluble organic solvent | | (D) Water | | Fine organic pigment |
|---|---|---|---|---|---|---|---|---|---|
| | Kind | Blending Amount (g) | Kind | Blending Amount (g) | Kind | Blending Amount (g) | Blending Amount (g) | Parts by mass/ (B) 100 parts by mass | Primary particle size (nm) |
| Example 2 | | | | | | | | | |
| Comparative Example 3 | A-2 | 128 | B-1 | 638 | C-1 | 157 | 0.0 | 0.0 | 65 |
| Example 6 | A-2 | 128 | B-1 | 638 | C-1 | 157 | 10.2 | 1.6 | 56 |
| Comparative Example 4 | A-3 | 128 | B-1 | 638 | C-1 | 157 | 0.0 | 0.0 | 49 |
| Example 7 | A-3 | 128 | B-1 | 638 | C-1 | 157 | 10.2 | 1.6 | 42 |
| Example 8 | A-1 | 128 | B-2 | 638 | C-1 | 157 | 10.2 | 1.6 | 53 |
| Comparative Example 5 | A-1 | 128 | B-2 | 638 | C-1 | 157 | 0.0 | 0.0 | 65 |
| Example 9 | A-1 | 128 | B-1 | 638 | C-2 | 157 | 10.2 | 1.6 | 49 |

It was confirmed that the pigments obtained in Examples 1 to 5 had a small primary particle size as compared to those obtained in Comparative Examples 1 and 2. In addition, it was also confirmed that the pigments obtained in Examples 6, 7 and 8 had a small primary particle size as compared to those obtained in Comparative Examples 3, 4 and 5, respectively. From these results, it was recognized that by blending not less than 0.6 part by mass and not more than 3.6 parts by mass of water into 100 parts by mass of the raw material organic pigment upon kneading, it was possible to obtain the fine organic pigment having a very small primary particle size.

Example 10

(Preparation of Pigment Paste)

The same procedure as in (kneading step) and (cleaning step) of Example 3 was conducted, thereby obtaining a pigment paste 1 having a solid content of 22% by mass.

(Preparation of Water Dispersion)

Six hundred grams (600 g) of the pigment paste 1, a mixed solution containing 44 g of a styrene-acrylic acid-based polymer ("Joncryl 68" available from BASF; hereinafter also referred to as "J68") and 143 g of MEK, 21.7 g of a 5N sodium hydroxide aqueous solution and 230 g of ion-exchanged water were mixed with each other to prepare a mixture thereof. The resulting mixture was mixed using a disper blade at 20° C. at a rotating speed of 7000 rpm for 1 h, and further subjected to dispersing treatment by passing through "MICROFLUIDIZER" available from Microfluidics Corp., 20 times under a pressure of 150 MPa. The resulting dispersion was held under reduced pressure at 60° C. to remove MEK therefrom, and subjected to filtration through a filter (available from Fujifilm Corporation; acetyl cellulose membrane; pore size: 5 μm), thereby obtaining a water dispersion 1 having a solid content of 20% by mass.

(Preparation of Ink Solvent)

Five grams (5.0 g) of 1,2-hexanediol (available from Tokyo Kasei Kogyo Co., Ltd.), 5.0 g of 2-pyrrolidone (available from Wako Pure Chemical Industries Ltd.), 12.0 g of glycerol (available from Kao Corporation), 10.0 g of triethylene glycol monobutyl ether ("Butyl Triglycol" available from Nippon Nyukazai Co., Ltd.), 0.5 g of an acetylene glycol-based surfactant "SURFYNOL 465" (available from Nissin Chemical Industry Co., Ltd.), 0.5 g of an acetylene glycol-based surfactant "OLFINE E1010" (available from Nissin Chemical Industry Co., Ltd.), 0.3 g of an antiseptic agent "Ploxel XL2" (available from Avecia K.K.) and 26.7 g of ion-exchanged water were uniformly mixed with each other, thereby preparing an ink solvent (hereinafter also referred to as a "vehicle").

(Preparation of Ink)

While stirring 40 g of the water dispersion 1, 60 g of the vehicle was added and mixed therein, and the resulting mixture was subjected to filtration through a filter (available from Fujifilm Corporation; acetyl cellulose membrane; pore size: 1.2 μm), thereby obtaining an ink 1.

Example 11

(Preparation of Pigment Paste)

The raw material organic pigment, water-soluble inorganic salt and water-soluble organic solvent as shown in Example 3 in Table 1 were kneaded together using a dispersion kneader "TD0.5-3M Model" available from Toshin Co., Ltd., without application of a pressure thereto at a rotating speed of 30 r/min for 0.5 h while maintaining the contents of the kneader at a temperature of from 40 to 60° C. Further, ion-exchanged water was added in such an amount as shown in Example 3 in Table 1 to the kneader, and the contents of the kneader were kneaded under the same conditions as described above for 2.0 h. Further, a mixed solution containing 44.7 g of J68 and 104.3 g of DEG was added to the kneader, and the contents of the kneader were kneaded under the same conditions as described above for 1.0 h. The resulting mixture was subjected to the same procedure as in (cleaning step) of Example 3, thereby obtaining a pigment paste 2 having a solid content of 27% by mass.

(Preparation of Water Dispersion)

A mixture containing 600 g of the pigment paste 2, 132 g of MEK, 20.0 g of a 5N sodium hydroxide aqueous solution and 205 g of ion-exchanged water was prepared. The resulting mixture was mixed using a disper blade at 20° C. at a rotating speed of 7000 rpm for 1 h, and further subjected to dispersing treatment by passing through "MICROFLUIDIZER" available from Microfluidics Corp., 5 times under a pressure of 150 MPa. The resulting dispersion was held under reduced pressure at 60° C. to remove MEK therefrom, and subjected to filtration through a filter (available from Fujifilm Corporation; acetyl cellulose membrane; pore size: 5 μm), thereby obtaining a water dispersion 2 having a solid content of 20% by mass.

(Preparation of Ink)

While stirring 40 g of the water dispersion 2, 60 g of the aforementioned vehicle was added and mixed therein, and the resulting mixture was subjected to filtration through a filter (available from Fujifilm Corporation; acetyl cellulose membrane; pore size: 1.2 μm), thereby obtaining an ink 2.

The resulting inks 1 and 2 were measured for particle size and gloss thereof. The results are shown in Table 2.

TABLE 2

|  |  | Particle size of ink | 20° Gloss |
|---|---|---|---|
| Example 10 | Ink 1 | 105 nm | 41 |
| Example 11 | Ink 2 | 91 nm | 53 |

As shown in Example 10, it was recognized that when producing the water-based ink using the pigment paste obtained by blending water upon kneading, it was possible to obtain an ink having a fine particle size and an excellent gloss. Further, as shown in Example 11, it was recognized that when producing the water-based ink using the pigment paste obtained by kneading the kneaded mixture obtained by blending water therein, with the polymer upon kneading, it was possible to obtain an ink having a much finer particle size and a more excellent gloss.

INDUSTRIAL APPLICABILITY

The present invention provides a useful process for producing a fine organic pigment that is usable in the applications such as inks for ink-jet printing and color filters.

The invention claimed is:

1. A process for producing a fine organic pigment, comprising step 1 of kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water-soluble inorganic salt.

2. The process according to claim 1, wherein the water is blended in an amount of not less than 1.1 parts by mass on the basis of 100 parts by mass of the water-soluble inorganic salt.

3. The process according to claim 1, wherein the water is blended in an amount of not less than 2.5 parts by mass and not more than 16 parts by mass on the basis of 100 parts by mass of the water-soluble organic solvent.

4. The process according to claim 1, wherein the water is blended in an amount of not less than 3.0 parts by mass and not more than 20 parts by mass on the basis of 100 parts by mass of the raw material organic pigment.

5. The process according to claim 1, wherein the water is blended in an amount of not less than 0.4 part by mass and not more than 2.8 parts by mass on the basis of 100 parts by mass of a total amount of the raw material organic pigment, the water-soluble inorganic salt and the water-soluble organic solvent.

6. The process according to claim 1, wherein the kneading step 1 comprises the following steps 1-1 and 1-2:
step 1-1: mixing the raw material organic pigment, the water-soluble inorganic salt and the water-soluble organic solvent with each other; and
step 1-2: kneading a mixture prepared by blending the mixture obtained in the step 1-1 and the water.

7. The process according to claim 1, wherein the water-soluble inorganic salt is at least one compound selected from the group consisting of an alkali metal chloride and an alkali metal sulfate.

8. The process according to claim 1, wherein the water-soluble organic solvent is an aliphatic compound comprising not less than 1 and not more than 3 alcoholic hydroxyl groups.

9. A process for producing a dispersion, comprising the following steps 1 and 1.1
step 1: kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water soluble inorganic salt; and
step 1.1: dispersing the fine organic pigment obtained in the step 1 and a solvent.

10. A process for producing an ink, comprising the following steps 1 and 1.1
step 1: kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water soluble inorganic salt; and
step 1.1: dispersing the fine organic pigment obtained in the step 1 and a solvent.

11. A process for producing a paste of a fine organic pigment, comprising the following steps 1 and 2:
step 1: kneading a mixture prepared by blending a raw material organic pigment, a water-soluble inorganic salt, a water-soluble organic solvent and water with each other, the water being blended in an amount of not less than 0.6 part by mass and not more than 4.0 parts by mass on the basis of 100 parts by mass of the water-soluble inorganic salt; and
step 2: cleaning the kneaded mixture obtained in the step 1.

12. The process for producing a paste of a fine organic pigment according to claim 11, further comprising the following step:
kneading the kneaded mixture obtained in the step 1, with a polymer,
wherein the step 2 is a step of cleaning the kneaded mixture obtained from kneading the mixture obtained in the step 1, with a polymer.

13. A process for producing a dispersion, comprising the following step:
subjecting the paste of the fine organic pigment produced by the process according to claim 11, an organic solvent and water to dispersing treatment.

14. A process for producing an ink, comprising the following step:
mixing the dispersion produced by the process according to claim 13 with at least one material selected from the group consisting of water and an organic solvent.

* * * * *